US005504799A

United States Patent [19]

Suzuki

[11] Patent Number: 5,504,799

[45] Date of Patent: Apr. 2, 1996

[54] X-RAY GENERATION TUBE FOR IONIZING AMBIENT ATMOSPHERE

[75] Inventor: Kenji Suzuki, Hamamatsu, Japan

[73] Assignee: Hamamatsu Photonics K.K., Shizuoka, Japan

[21] Appl. No.: 261,179

[22] Filed: Jun. 13, 1994

[30] Foreign Application Priority Data

Jun. 18, 1993 [JP] Japan .................................. 5-148001

[51] Int. Cl.$^{6}$ .................................................. H01J 35/00

[52] U.S. Cl. ......................... 378/136; 378/121; 378/143

[58] Field of Search .................................. 378/119, 121, 378/122, 136, 137, 138, 143

[56] References Cited

U.S. PATENT DOCUMENTS

| | | | |
|---|---|---|---|
| 2,922,060 | 1/1960 | Rajewsky | 378/143 X |
| 3,138,729 | 6/1964 | Henke | 313/57 |
| 3,821,579 | 6/1974 | Burns | 378/121 |
| 4,912,738 | 3/1990 | Turchi | 378/136 X |
| 5,090,043 | 2/1992 | Parker et al. | 378/121 |

FOREIGN PATENT DOCUMENTS

| | | | |
|---|---|---|---|
| 569849 | 4/1924 | France | H01J 35/02 |
| 106464 | 4/1956 | Germany | H01J 35/02 |
| 12-5501 | 6/1937 | Japan . | |
| 62-44936 | 2/1987 | Japan | H01J 27/24 |
| 2297850 | 12/1990 | Japan | H01J 35/08 |
| 548673 | 10/1942 | United Kingdom | H01J 35/02 |
| 9209998 | 6/1992 | WIPO | H01J 35/00 |

*Primary Examiner*—David P. Porta
*Attorney, Agent, or Firm*—Sughrue, Mion, Zinn, Macpeak & Seas

[57] ABSTRACT

An X-ray generation tube capable of providing ionization to ambient atmosphere in a wide area by radiating X-rays in various directions. The X-ray generation tube includes a container body formed of an X-ray transmittable material. The container body has one open end. A target membrane is formed at an inner surface of the container body for receiving electrons and emitting X-rays. A base plugs the open end of the container body and has pins. A cathode is supported by the pins and is disposed at a central portion of the container body for generating the electrons. If the container body has an elongated cylindrical shape, the cathode is positioned at and extends along a central axis of the cylinder. If the container body has a spherical shape, the cathode is positioned adjacent to a spherical center. Since the target membrane is provided at substantially all inner surfaces of the container body, and since the distances between any one of the points on the target membrane and the cathode are the same, X-rays can be radiated from the outer surface of the container body and directed toward an extended region in a uniform manner, resulting in a uniform radiation.

18 Claims, 4 Drawing Sheets

X-RAY GENERATION TUBE FOR IONIZING AMBIENT ATMOSPHERE

BACKGROUND OF THE INVENTION

The present invention relates to a transmission type X-ray generation tube having an X-ray window and a target, and more particularly, to a type thereof capable of providing ionization to ambient atmosphere.

Recently, gas ionization to the ambient air or gas is required for neutralization of a charged article, or for providing a negative ion atmosphere for human comfort. Further, positive gas ionization is also used for sterilization of the ambient atmosphere.

To this effect, Japanese Patent Application Kokai No. Sho-62-44936 discloses an ion beam generation system provided with a synchrotrons radiation device. However, no proposals have yet been made in connection with the employment of a transmission type X-ray generation tube for this purpose.

RELATED ART

A transmission type X-ray generation tube has been known which generates a relatively weak X-ray having a specific wavelength for the purpose of analysis of a substance or diagnosis.

The conventional transmission type X-ray generation tube includes a cathode which releases electrons, a grid for controlling the orientation of the electrons, a transmission type target which receives the electrons at one surface thereof and emits X-rays from an opposite surface, and an X-ray transmission window for releasing the X-rays. These are accommodated in a cylindrical hermetic container body. Such a conventional tube is disclosed in Japanese Patent Application Kokoku No. Sho-37-5501 and Japanese Patent Application Kokai No. Hei-2-297850.

In such a conventional transmission type X-ray generation tube, the X-rays are to be radiated to a limited specific area for the image pick-up, and therefore, the grid is used for directing the generated electrons to a concentrated area in order to provide a point radiation source. In this case, several electrons generated from the cathode may not reach the target due to inaccuracy in control by the grid. Such a conventional X-ray generation tube may not be available for providing ionization atmosphere for an extended or wide area.

SUMMARY OF THE INVENTION

It is therefore, an object of the present invention to provide an X-ray generation tube capable of efficiently providing an ionization atmosphere within an extended wire area.

This and other objects of the present invention will be attained by providing an X-ray generation tube for radiating X-rays toward a wide area to ionize an ambient gas. This tube comprises a container body, a base, a cathode and a target membrane. The container body is formed of an X-ray transmittable material and has an inner peripheral surface and one open end. The base plugs into the open end of the container body, and implants therein first and second pins. The cathode is disposed in the container body and has one terminal supported to the first pin and another terminal supported to the second pin for generating electrons. The target membrane is formed on the inner peripheral surface of the container body for emitting X-rays upon receipt of the electrons. The distances between any one of the points on the target membrane and the cathode are equal to one another.

DETAILED DESCRIPTION OF THE PREFERRED EMBODIMENTS

Figure 1:
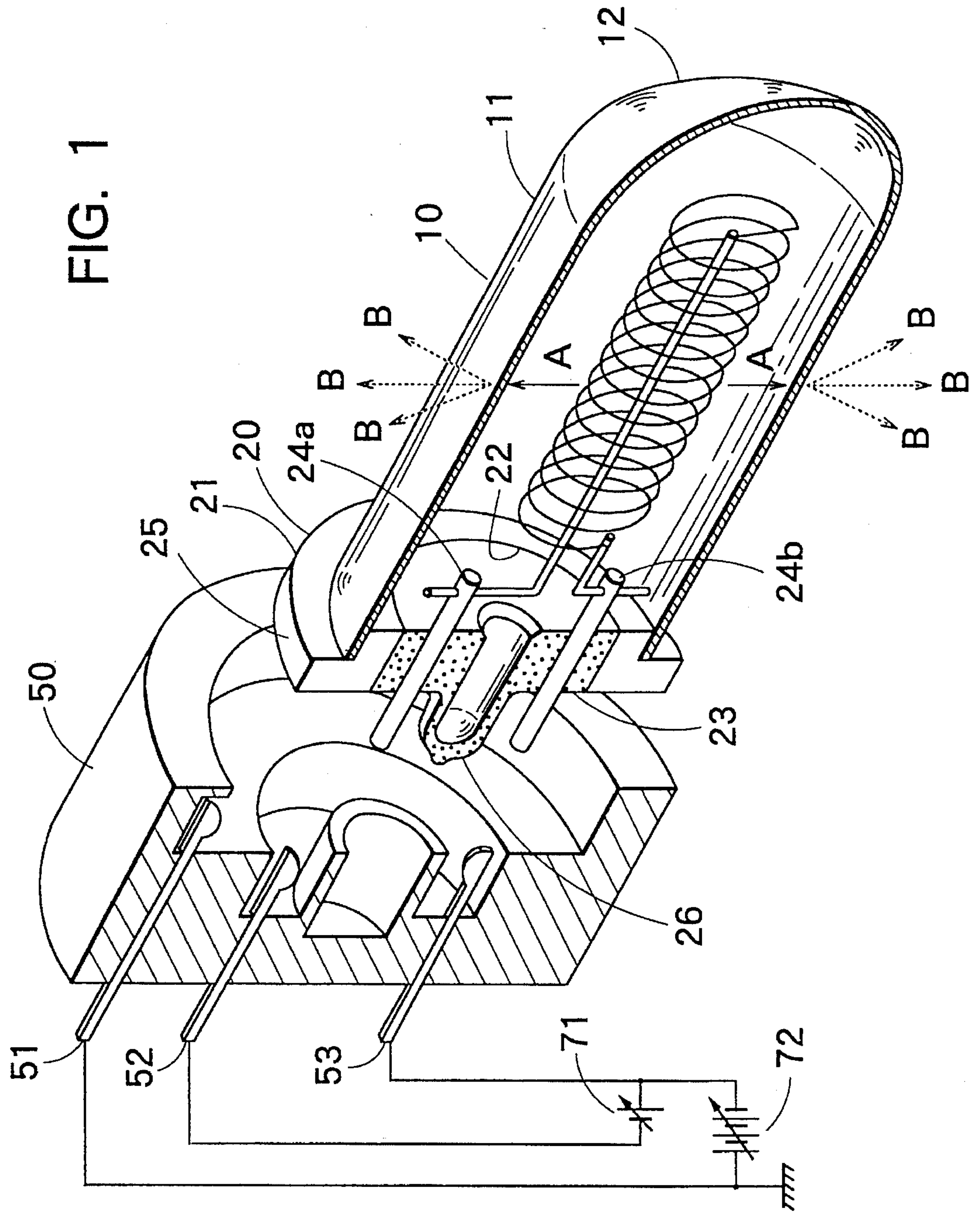
FIG. 1 is a perspective cross-sectional view showing an X-ray generation tube according to a first embodiment of the present invention.

An X-ray generation tubes according to a first embodiment of the present invention will be described with reference to FIGS. 1 and 2.

The X-ray generation tube 1 generally includes a container body 10 whose one end is open, a target membrane 40 formed on an inner peripheral surface of the container body 10, a base 20 provided at the open end of the container body 10, and a cathode 30 positioned concentrically with the container body 10.

The container body 10 serves as a target and also serves as X-ray transmission window. The container body 10 has an elongated cylindrical portion 11 and a hemispherical portion 12 provided contiguously with a tip end of the elongated cylindrical portion 11. Approximately vacuum pressure is maintained in an interior of the container body 10.

The container body 10 is formed of an X-ray transmittable material having high heat conductivity such as beryllium, glassy carbon (graphite), polyimide, aluminum and boron nitride. Thickness of the container body is in a range of from 200 microns to 1 mm in case of beryllium, and from 200 microns to 500 micron meters in case of carbon and aluminum. Therefore, the container body 10 has a proper mechanical strength. The cylindrical portion 11 of the container body 10 has an available diameter of 25 to 40 mm, and available length of 30 to 150 mm. Further, the hemispherical portion 12 has an available diameter of from 25 mm to 40 mm.

Figure 2:
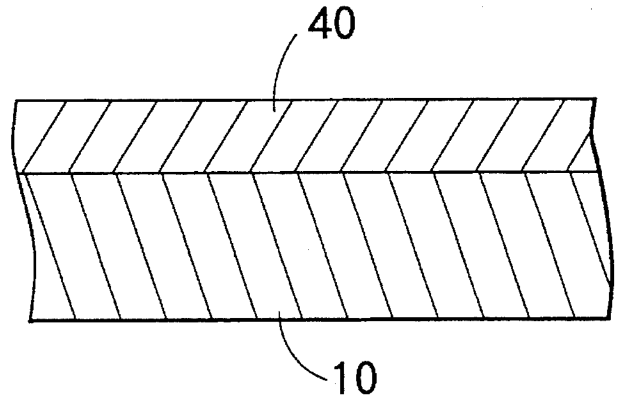
FIG. 2 is a partially enlarged cross-sectional view showing a wall of a container body of the X-ray generation tube according to the first embodiment of the present invention.

The target membrane 40 which emits X-rays upon receipt of the electrons is formed on the inner surfaces of the elongated cylindrical portion 11 and the hemispherical portion 12 of the container body 10 by vacuum deposition method or plating as shown in FIG. 2. Thickness of the target membrane is dependent on the constituent material. However, the thickness is preferably minimal yet capable of emitting the X-rays. With such an arrangement, X-ray absorption in the target membrane can be restrained to a minimum level. Even though the target membrane 40 has a minimum thickness, the target membrane 40 may not be easily bent since it is held by the container body 10 having a proper mechanical strength. Therefore, uniformity in generating the X-rays from the target can be improved. Further, heat radiation of the target membrane can be improved by using a material having high thermal conductivity in manufacturing the container body 10.

Tungsten is used as the material of the target membrane 40. In this case, the thickness of the membrane is in a range of 500 to 3000 Angstroms. Materials other than tungsten are also available, such as titanium, copper, iron, chromium, rhodium, etc.

The base 20 plugging the open end of the container body 10 includes an outer body 21 formed of a metal, serving as an electrode and having a central circular hole 22, and a stem 23 fitted in the central circular hole 22, provided with a hollow convex portion 26 at its center. First and second pins 24*a* and 24*b* are implanted in portions adjacent the convex portion 26 of the stem 23. Incidentally, the convex portion 26 is formed when providing a vacuum in the container body 10.

The cathode 30 is supported by the pins 24*a*, 24*b* and is positioned concentrically with the center axis of the container body 110. More specifically, the cathode 30 is formed by spirally winding a tungsten wire. In this case, a spiral center is positioned coincident with the central axis of the container body 10, so that the distance between the target membrane 40 and the cathode wire 30 stays the same with respect to the radial direction of the container body 10. Accordingly, distance between a the target membrane 40 and the cathode 30 stays constant at any location. Further, because of the spiral arrangement of the cathode, the electron releasable area can be increased.

As shown in FIG. 1, the X-ray generation tube 1 is fitted with a socket 50, so that predetermined electric power is applied to the tube 1 through plugs 51, 52, 53 provided in socket 50. The outer body 21 is supplied with between 3 KV to 20 KV direct electrical current from a direct electrical current source 72 via plug 51, provided in the socket 50. The pins 24*a*, 24*b* are supplied with several V direct electrical current from the direct electrical current source 71 via plugs 52, 53 provided in the socket 50. In the illustrated embodiment, direct current is used. However, alternating electrical current is also available as the electrical current applied to the outer body 21 and pins 24*a*, 24*b*. Further, in FIG. 1, the outer body 21 is grounded. Instead, however, the pins 24*a*, 24*b* can be grounded.

Figure 3:
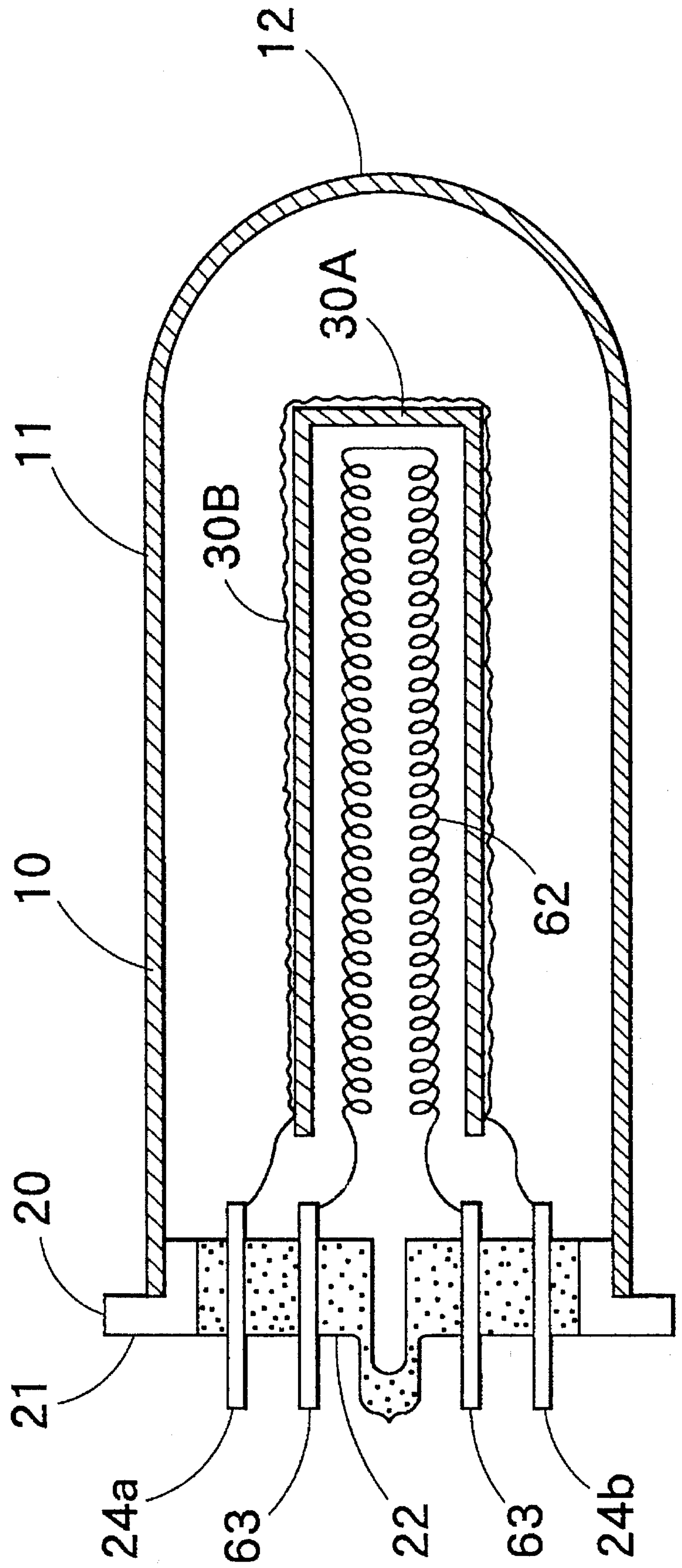
FIG. 3 is a cross-sectional view showing a modification to the first embodiment with respect to an arrangement of a cathode.
Figure 4:
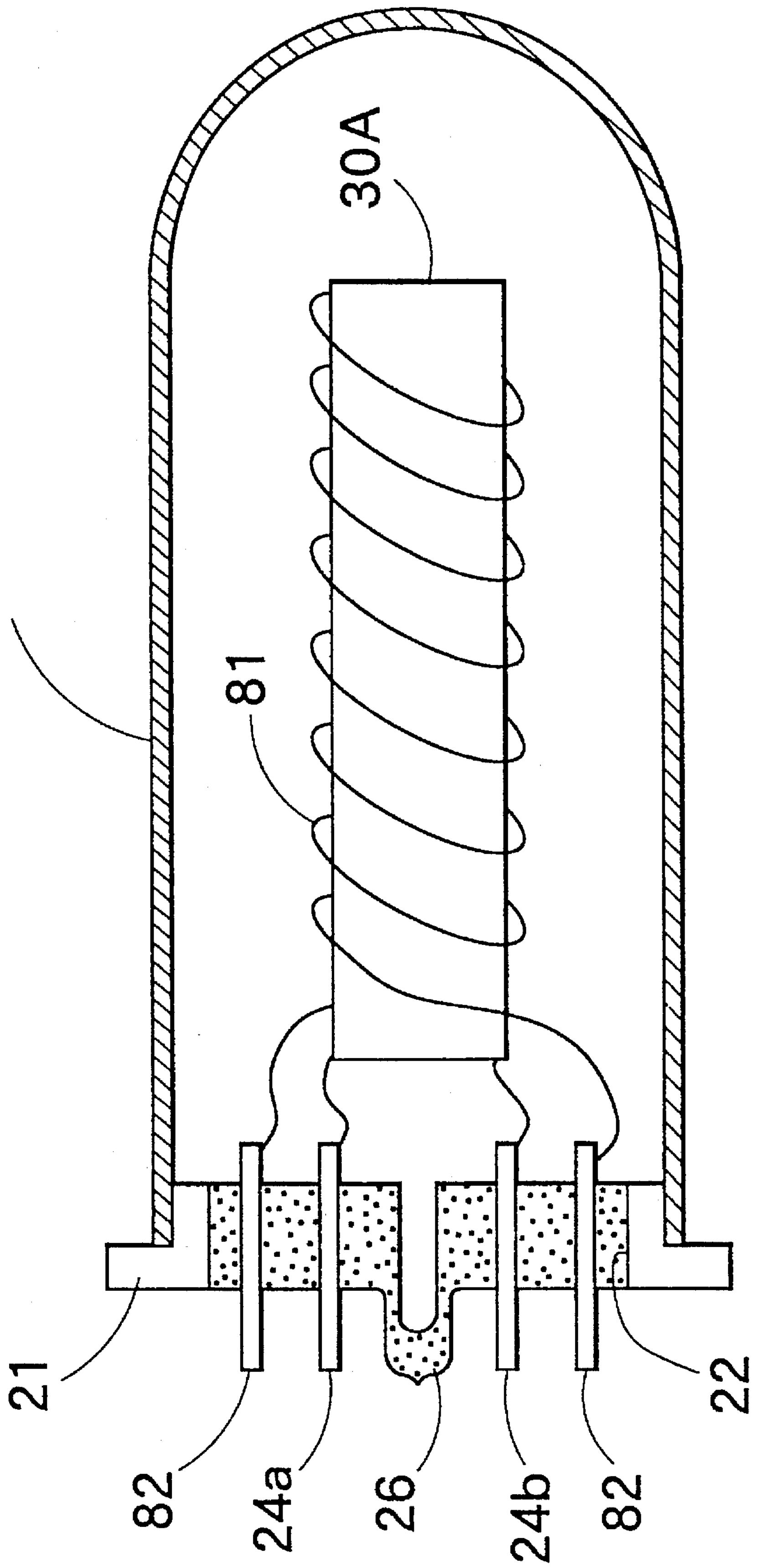
FIG. 4 is a cross-sectional view showing another modification to the first embodiment with respect to an arrangement of a cathode.

Several modifications to the cathode are shown in FIGS. 3 and 4. In the first modification shown in FIG. 3, a cathode is provided by a hollow cylinder 30A formed of a metal such as a nickel or a ceramic material, and an oxide cathode material layer 30B (BaO—CaO—SrO—MgO) coated over an outer peripheral surface of the hollow cylinder 30A. The hollow cylinder 30A is supported by the pins 24*a*, 24*b* in such a manner that the hollow cylinder 30A is coaxial with the container body 10. A heater 62 is disposed in an interior of the cylinder 30A. In this case, another set of pins 63 must be implanted in the base 20 for supplying an electrical current to the heater 62. By providing the heater 62, heating of the cathode 30A, 30B is promoted, to thus promote generation of the electrons therefrom.

In a second modification shown in FIG. 4, a cylindrical cathode 30A is coaxial to with the container body 10, similar to the first modification. Further, a grid 81 is spirally disposed over the cylindrical cathode 30A in a concentrical relation thereof. With this structure, electrical current directed from the cathode to the target (target current) can be controlled by controlling electrical voltage applied to the grid 81 in order to control the X-ray radiation amount. Another set of pins 82, 82 must be implanted in the base 20 for supporting the grid 72.

As a material of the cathode, barium-impregnated tungsten is also available. It is also possible to use a cold cathode material or field emitter material such as MgO which may be coated on an outer peripheral surface of a hollow cylinder. Incidentally, if a cold cathode material such as MgO is used as the material of the cathode, a prolonged service life of the cathode can be provided.

Next, operation in the X-ray generation tube according to the first embodiment will be described. Electric power is applied to the cathode 30 from the direct electric current source 71, for heating the cathode 30 to thus release electrons from the cathode. On the other hand, the target membrane 40 also serves as an electron accelerator. If potential difference is provided between the target membrane 40 and the cathode 30 upon electrical power supply to the target 40 from the direct current source 72, the released electrons are accelerated and impinged on the target membrane 40 at high speed, as shown by arrows A. Upon receipt of the electrons, the target membrane 40 emits X-rays which are inherent to the material of the target membrane. Since the container body 10 has the cylindrical portion 11 and the hemispherical portion 12 and is formed of X-ray transmittable beryllium, the X-rays can be radiated outwardly as shown by arrows B from an entire outer surface of the container body 10. As a result, X-rays can be radiated toward a wide area from the outer surface of the cylindrical portion 11 and the hemispherical portion 12 of the container body 10.

Further, when viewing a vertical cross-section or a radial direction of the container 10, radial distances between any point on the target membrane 40 and the cathode 30 are equal to one another. Therefore, most of the electrons generated at the cathode can be uniformly impinged onto the target membrane. Consequently, electrons are efficiently utilized homogeneously.

An X-ray generation tube according to a second embodiment of the present invention will next be described with reference to FIG. 5. The second embodiment differs from the first embodiment in that, in the first embodiment, the X-ray emitting surfaces of the container body 110 are the surfaces of the elongated cylindrical portion 11 and the hemispherical portion 12, whereas in the second embodiment, as shown in FIG. 5, a major X-ray emitting surface is a surface of a substantially spherical portion 111.

In the second embodiment, a container body 110 has the substantially spherical portion 111 and a shortened cylindrical portion 112 provided integrally therewith. A target membrane is formed at least at an inner surface of the spherical portion 111. The shortened cylindrical portion 112 has a diameter ranging from 25 mm to 40 mm and a length ranging from 30 mm to 150 mm. Further, a diameter of the spherical portion 111 is in a range of from 25 mm to 50 mm. A cathode 30C is disposed at a substantially spherical center portion of the spherical portion 110.

Figure 5:
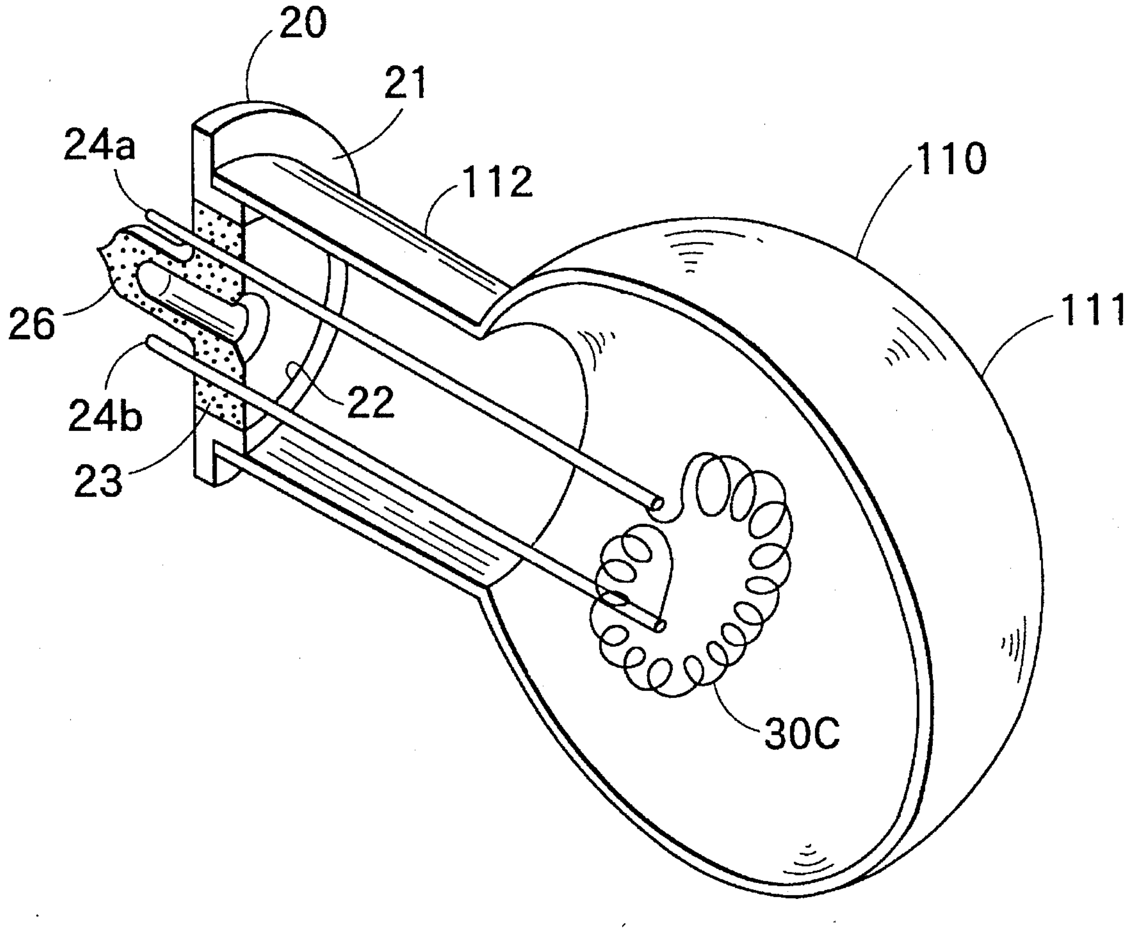
FIG. 5 is a perspective cross-sectional view showing an X-ray generation tube according to a second embodiment of the present invention.

Further, in FIG. 5, like parts and components are designated by the same reference numerals as those shown in FIGS. 1 through 4 to avoid duplicating the description. Thus, the concept of equal distance between the target membrane and the cathode 30C at any location of the target membrane is the same as that of the first embodiment. Furthermore, the material of the container body 110 is the same as that of the first embodiment, including beryllium, graphite, polyimide, boron nitride, and aluminum.

Accordingly, the second embodiment performs its operation similarly to that of the first embodiment. That is, X-rays can be radiated toward the wide area from the spherical portion 111 of the container body 110. If the target membrane is also coated on an inner surface of the shortened cylindrical portion 112, X-rays can also be radiated therefrom, even though the equi-distant concept between the cathode and the target is not maintained.

Incidentally,in the second embodiment, similar to the first embodiment, a material of the cathode could be barium-impregnated tungsten. Further, a cathode can be made by a hollow tube formed in a toroidal shape, and a cold cathode material or field emitter material such as MgO can be coated on an outer peripheral surface of the toroidal tube. Furthermore, a cathode can be provided by a hollow tube formed in a toroidal shape and is made of a metal such as a nickel or a ceramic material. In this case, and oxide cathode material (BaO—CaO—SrO—MgO) is coated over an outer peripheral surface of the toroidal cathode. Further, a heater can be disposed in an interior of the toroidal cathode.

In the present invention, since X-rays can be radiated from the substantially entire outer surface of the container body, the X-rays can be spread to an extended area. Therefore, ionization of ambient atmosphere can be efficiently performed by using this X-ray generation tube. Further, because of the equi-distant arrangement between the cathode and the target membrane, X-rays can be radiated in a uniform density, and substantially all electrons generated at the cathode can be utilized for conversion into X-rays. Further, since efficient X-ray generation is obtained by a simple X-ray generation tube, an overall apparatus which accommodates the tube can have a compact size, and power saving apparatus can result.

While the invention has been described in detail and with reference to specific embodiments thereof, it would be apparent to those skilled in the art that various changes and modifications may be made without departing from the spirit and scope of the invention.

What is claimed is:

1. An X-ray generation tube for radiating X-rays toward a wide area to ionize an ambient gas, comprising:

- a container body formed of an X-ray transmittable material and having an inner peripheral surface and one open end,
- a base portion having a stem portion plugging the open end of the container body, the stem portion implanting therein first and second pins;
- a cathode disposed in the container body and having one terminal supported to the first pin and another terminal supported to the second pin for generating electrons; and
- a target membrane formed on the inner peripheral surface of the container body for emitting X-rays upon receipt of the electrons, wherein given any two points on said target membrane, the respective distances of said points to said cathode are the same.

2. The X-ray generation tube as claimed in claim 1, wherein the container body comprises:

- an elongated cylindrical portion having one end provided with the open end and having another end;
- a hemi-spherical portion integrally connected to the other end of the elongated cylindrical portion, the elongated cylindrical portion having a circular cross-section and defining a central axis extending in a lengthwise direction thereof, the target membrane being formed on the inner surfaces of the elongated cylindrical portion and the hemispherical portion.

3. The X-ray generation tube as claimed in claim 2, wherein the cathode is positioned at and extends along the central axis.

4. The X-ray generation tube as claimed in claim 3, wherein the container body is formed of a material selected from the group consisting of beryllium, graphite, polyimide, boron nitride, and aluminum.

5. The X-ray generation tube as claimed in claim 4, wherein a wall of the container body has a thickness ranging from 200 microns to 1 mm.

6. The X-ray generation tube as claimed in claim 5, wherein the target membrane has a thickness ranging from 500 to 3000 Angstroms.

7. The X-ray generation tube as claimed in claim 3, wherein the cathode is in a spiral form, a spiral center thereof being coaxial with the central axis.

8. The X-ray generation tube as claimed in claim 3, wherein the cathode is formed of a material selected from the group consisting of tungsten, barium-impregnated tungsten and a cold cathode material.

9. The X-ray generation tube as claimed in claim 3, wherein the cathode comprises a hollow cylindrical member connected to the first and the second pins, the hollow cylindrical member having an outer peripheral surface coated with a cathodic oxide material and having an inner hollow space disposing therein a heater.

10. The X-ray generation tube as claimed in claim 9, wherein the hollow cylindrical member is formed of one of a metal and ceramic.

11. The X-ray generation tube as claimed in claim 10, further comprising a grid spirally disposed over the cathode, a spiral center of the grid being coincident with a central axis of the cathode.

12. The X-ray generation tube as claimed in claim 1, wherein the container body comprises:

- a shortened cylindrical portion having one end provided with the open end and having another end; and
- a substantially spherical portion integrally connected to the other end of the shortened cylindrical portion, the spherical portion having a spherical center, the target membrane being formed at least on an inner surface of the spherical portion.

13. The X-ray generation tube as claimed in claim 12, wherein the cathode is positioned adjacent the spherical center.

14. The X-ray generation tube as claimed in claim 13, wherein the container body is formed of a material selected from the group consisting of beryllium, graphite, polyimide, boron nitride, and aluminum.

15. The X-ray generation tube as claimed in claim 14, wherein a wall of the container body has a thickness ranging from 200 microns to 1 mm.

16. The X-ray generation tube as claimed in claim 15, wherein the target membrane has a thickness ranging from 500 to 3000 Angstroms.

17. The X-ray generation tube as claimed in claim 13, wherein the cathode is in a spiral form.

18. The X-ray generation tube as claimed in claim 13, wherein the cathode is formed of a material selected from the group consisting of tungsten, barium-impregnated tungsten and a cold cathode material.

* * * * *